(12) United States Patent
Miyata et al.

(10) Patent No.: US 6,660,601 B2
(45) Date of Patent: Dec. 9, 2003

(54) SEMICONDUCTOR DEVICE AND METHOD FOR FABRICATING THE SAME

(75) Inventors: Satoe Miyata, Soraku-sun (JP); Hiroyuki Umimoto, Takarazuka (JP); Michikazu Matsumoto, Usi (JP); Susumu Akamatsu, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/938,527

(22) Filed: Aug. 27, 2001

(65) Prior Publication Data

US 2002/0025662 A1 Feb. 28, 2002

(30) Foreign Application Priority Data

Aug. 29, 2000 (JP) ........................................ 2000-258683

(51) Int. Cl.⁷ ............................................. H01L 21/336
(52) U.S. Cl. ....................... 438/301; 438/303; 438/305; 438/530
(58) Field of Search ................................ 438/301, 303, 438/305, 306, 530

(56) References Cited

U.S. PATENT DOCUMENTS 5,933,740 A * 8/1999 Chapman .................... 438/303
6,117,737 A * 9/2000 Wang et al. ................. 438/275
6,255,703 B1 * 7/2001 Hause et al. ................. 257/384

OTHER PUBLICATIONS

Wolf, "Hot–Carrier Resistant Processing and Device Structures," Silicon Processing for the VLSI Era—vol. III: The Submicron MOSFET, Lattice Press (1995), pp. 595–598.*

* cited by examiner

Primary Examiner—Mary Wilczewski
Assistant Examiner—Toniae M. Thomas
(74) Attorney, Agent, or Firm—Nixon Peabody LLP; Donald R. Studebaker

(57) ABSTRACT

Ions of boron as a dopant are implanted using a gate electrode and an isolation film as a mask, thereby forming an ion-implanted layer as a prototype for an extended heavily doped layer. In this process step, a peak concentration of the dopant existing in the ion-implanted layer is set close to, and equal to or less than, a solid solubility at a process temperature for a first annealing process. Then, almost all of the dopant existing in the extended heavily doped layer is activated by performing the first annealing process. Thereafter, a sidewall and an ion-implanted layer as a prototype for a heavily doped source/drain layer are formed, and then the heavily doped source/drain layer is defined by performing a second RTA process.

7 Claims, 8 Drawing Sheets

SEMICONDUCTOR DEVICE AND METHOD FOR FABRICATING THE SAME

BACKGROUND OF THE INVENTION

The present invention relates to a semiconductor device and a method for fabricating the device and more particularly relates to a semiconductor device including low resistance heavily doped regions and a method for fabricating the device.

Recently, the number of devices integrated for a semiconductor integrated circuit has been increasing steeply and MIS semiconductor devices have been downsized drastically. Thus, to suppress a short channel effect and increase the drivability thereof, a gate electrode has to have its resistance decreased and an extended heavily doped layer, which is defined under the edges of the gate electrode as parts of source/drain regions, needs to have its resistance decreased and its junction depth reduced. Hereinafter, a known method for fabricating a p-channel MIS semiconductor device including an extended heavily doped layer will be described with reference to FIGS. 6A through 6D. FIGS. 6A through 6D are cross-sectional views illustrating known process steps for fabricating an MIS semiconductor device including an extended heavily doped layer.

First, in the process step shown in FIG. 6A, a trench isolation film 52 is formed in parts of an n-type semiconductor substrate 51 to define an active region. Then, a gate electrode 54 of polysilicon is formed over the active region in the semiconductor substrate 51 with a gate insulating film 53 interposed between them. Thereafter, ions of boron as a p-type dopant 55 are implanted using the gate electrode 54 and the isolation film 52 as a mask to form an ion-implanted layer 56 as a prototype for an extended heavily doped layer.

Next, in the process step shown in FIG. 6B, the substrate is heated to an elevated temperature for a short time. Specifically, the substrate is subjected to a first rapid thermal annealing (RTA) process under the conditions including 900° C. and 10 sec., for example, to activate the dopant existing in the ion-implanted layer 56. In this manner, an extended heavily doped layer 56a is formed.

Subsequently, in the process step shown in FIG. 6C, a silicon nitride film is deposited over the substrate under the conditions including 700° C. and 20 min., for example. Then, the silicon nitride film is etched anisotropically to form a sidewall 57 of silicon nitride on the side faces of the gate electrode 54. Thereafter, ions of boron as a p-type dopant 58 are implanted into the substrate using the gate electrode 54, sidewall 57 and isolation film 52 as a mask to form an ion-implanted layer 59 as a prototype for a heavily doped source/drain layer.

Then, in the process step shown in FIG. 6D, the substrate is subjected to a second RTA process under the conditions including 1100° C. and 0.5 sec., for example, to activate the dopant existing in the ion-implanted layer 59. In this manner, the extended heavily doped layer 56a and a heavily doped source/drain layer 59a are defined.

In a known method, an MIS semiconductor device is fabricated in the following manner to improve its drivability; the boron ions 55 are implanted at a low accelerating voltage in forming the ion-implanted layer 56 so that the extended heavily doped layer 56a has a shallow junction depth. Further, in forming the ion-implanted layer 56 by this process, the implant dose of the boron ions 55 is set as high as possible to decrease a parasitic capacitance produced between the extended heavily doped layer 56a and heavily doped source/drain layer 59a.

However, the MIS semiconductor device obtained by the known method has the following drawbacks.

Firstly, we found that if a dopant was implanted as much as possible to reduce the resistance of the extended heavily doped layer, the resistance rather increased in the final structure.

Secondly, we also found that after the structure had gone through many process steps succeeding the second RTA process, the junction depth of the extended heavily doped layer had increased very much in the resultant MIS semiconductor device. The greater the junction depth, the more likely punch-through or short channel effect occurs.

SUMMARY OF THE INVENTION

It is therefore an object of the present invention to clarify why those unfavorable phenomena occur and thereby provide a semiconductor device including low resistance heavily doped regions and a method for fabricating the device.

An inventive semiconductor device includes at least one heavily doped region that has been formed by introducing a dopant into a semiconductor layer. A maximum concentration of the dopant existing in the heavily doped region is at least greater than a predetermined percentage of a solid solubility of a first annealing process for activating the dopant and equal to or less than a solid solubility of a second annealing process that needs to be performed at the highest temperature after the dopant has been introduced into the semiconductor layer by an ion implantation process.

According to the present invention, almost all of a dopant existing in the heavily doped region can be activated. Thus, it is possible to suppress the heavily doped region from having its resistance increased by the deactivation (e.g., clustering or precipitation) of the dopant. As a result, a low resistance semiconductor device can be obtained. Further, the dopant may be introduced for an inventive semiconductor device at a dose lower than the dose for a known semiconductor device. Therefore, the junction depth of the dopant can be reduced and a semiconductor device with high drivability can be obtained.

In one embodiment of the present invention, almost all of the dopant existing in the heavily doped region has preferably been activated.

In another embodiment, the maximum concentration of the dopant may be 90 to 100% of the solid solubility at a process temperature of the first annealing process. In such an embodiment, almost all of the dopant can be activated through the first annealing process. Thus, no inactive dopant atoms will newly deactivate the activated dopant atoms even if annealing processes are carried out at low temperatures for a long time after that. Accordingly, the dopant can be activated with more certainty.

In an alternative embodiment, the maximum concentration of the dopant may be greater than the solid solubility at a process temperature of the first annealing process and may be 90 to 100% of the solid solubility at a process temperature of the second annealing process. Then, the heavily doped region may contain the dopant at the highest possible concentration that the second annealing process can cope with.

In still another embodiment, the inventive semiconductor device may include: a gate electrode, which has been formed over the semiconductor layer with a gate insulating film interposed between the gate electrode and the semiconductor layer; an extended heavily doped layer, which has been defined as the heavily doped region in parts of the semiconductor layer that are located beside the gate electrode; a sidewall, which has been formed on the side faces of the gate electrode; and a heavily doped source/drain layer, which has been defined in parts of the semiconductor layer that are located beside the sidewall to surround the outer periphery of, and be in contact with, the extended heavily doped layer, and which has a junction deeper than the junction of the extended heavily doped layer.

In yet another embodiment, the semiconductor layer may be a gate electrode of polysilicon and the gate electrode may include the heavily doped region. Then, an MIS semiconductor device can have its resistance reduced.

An inventive method for fabricating a semiconductor device includes the step of a) introducing a first dopant into at least part of a semiconductor layer by an ion implantation process, thereby forming a first ion-implanted layer in the part. The method further includes the step of b) subjecting the first ion-implanted layer to a first annealing process. And the method further includes the step of c) subjecting the semiconductor layer to a second annealing process, thereby forming a heavily doped region out of the first ion-implanted layer after the step b) has been performed. In the step a), the first dopant is introduced at such a dose that a maximum concentration of the first dopant when the first annealing process is over will be greater than a predetermined percentage of a solid solubility at a process temperature of the first annealing process and that a maximum concentration of the first dopant when the second annealing process is over will be equal to or less than a solid solubility at a process temperature of the second annealing process. In the step c), the second annealing process is performed at the highest process temperature in all process steps succeeding the step a).

According to the present invention, almost all of a dopant existing in a heavily doped region can be activated through annealing processes. Further, the dopant may be introduced in the inventive method at a dose lower than that adopted by a known method. Therefore, the junction depth of the dopant can be reduced and a semiconductor device with high drivability can be obtained.

In one embodiment of the present invention, almost all of the first dopant existing in the first ion-implanted layer is preferably activated through the first annealing process.

In another embodiment, the maximum concentration of the first dopant in the step b) may be 90 to 100% of the solid solubility at the process temperature of the first annealing process. In such an embodiment, almost all of the dopant can be activated through the first annealing process. Thus, no inactive dopant atoms will newly deactivate the activated dopant atoms even if annealing processes are performed at low temperatures for a long time after that. Accordingly, the dopant can be activated with more certainty.

Alternatively, the maximum concentration of the first dopant in the step b) may be greater than the solid solubility at the process temperature of the first annealing process. In the step c), the maximum concentration of the first dopant may be 90 to 100% of the solid solubility at the process temperature of the second annealing process. Then, the dopant may be introduced for the heavily doped region at the highest possible implant dose that the second annealing process can cope with.

In still another embodiment, before the step a) is performed, a gate electrode may be formed over the semiconductor layer with a gate insulating film interposed between the gate electrode and the semiconductor layer. In the step a), the first ion-implanted layer may be formed in parts of the semiconductor layer that are located beside the gate electrode by performing the ion implantation process using the gate electrode as a mask. The method may further include the steps of: forming a sidewall on the side faces of the gate electrode after the step b) has been performed; and introducing a second dopant by an ion implantation process using the gate electrode and the sidewall as a mask, thereby forming a second ion-implanted layer. The step c) may further include forming an extended heavily doped layer and a heavily doped source/drain layer out of the first and second ion-implanted layers, respectively, so that the extended heavily doped layer is located below edges of the gate electrode and that the heavily doped source/drain layer surrounds the outer periphery of, and is in contact with, the extended heavily doped layer and has a junction deeper than the junction of the extended heavily doped layer. The extended heavily doped layer may be the heavily doped region.

In yet another embodiment, the semiconductor layer may be a gate electrode of polysilicon and the heavily doped region may be defined in the gate electrode. Then, an MIS semiconductor device can have its resistance reduced.

In yet another embodiment, the first and second annealing processes may be performed as a single process step. Then, a low resistance semiconductor device with high drivability can be obtained through simpler process steps.

In yet another embodiment, after the first dopant has been introduced into the semiconductor layer in the step a), almost all of the first dopant is preferably activated by performing the first annealing process in the step b). The second dopant is preferably introduced into the semiconductor layer by the ion implantation process before the step c) is performed. And in the step c), the second dopant is preferably activated through the second annealing process, thereby forming the extended heavily doped layer and the heavily doped source/drain layer. Then, the first and second dopants can be activated with more certainty.

DESCRIPTION OF THE PREFERRED EMBODIMENTS (Analysis on the State of Dopant Existing in Extended Heavily Doped Layer)

In the known fabrication process, the dopant was introduced at as high a dose as possible because it was believed that the higher the dopant concentration in the extended heavily doped layer, the lower the resistance thereof would be. However, the resultant resistance increased contrary to their expectation.

Thus, the present inventors analyzed the states of the dopant in the process steps starting with the process step of forming the ion-implanted layer as a prototype for the extended heavily doped layer to look for such dopant ion implantation and annealing conditions as to further decrease the resistance. Hereinafter, the results of our analysis on the states of the dopant existing in the extended heavily doped layer in the known process steps will be described with reference to FIGS. 7A through 7D.

Figure 6A:
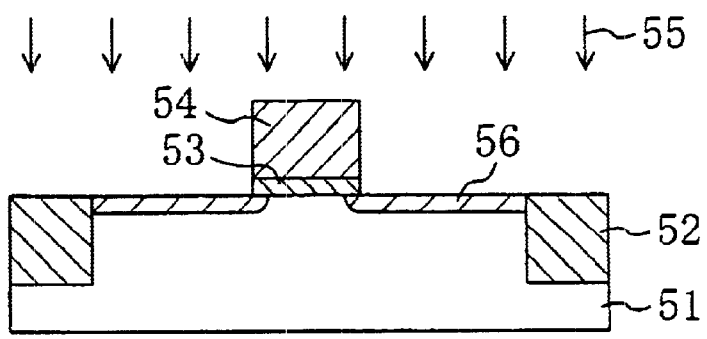
FIGS. 6A through 6D are cross-sectional views illustrating known process steps for fabricating a semiconductor device.
Figure 6B:
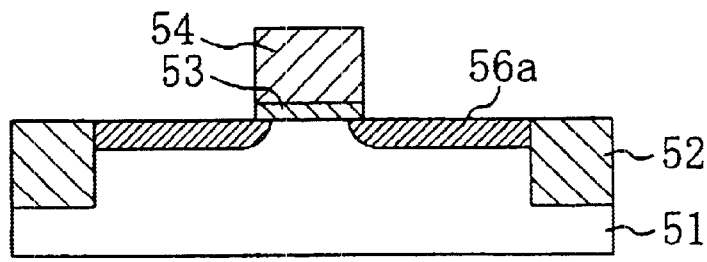
Figure 6C:
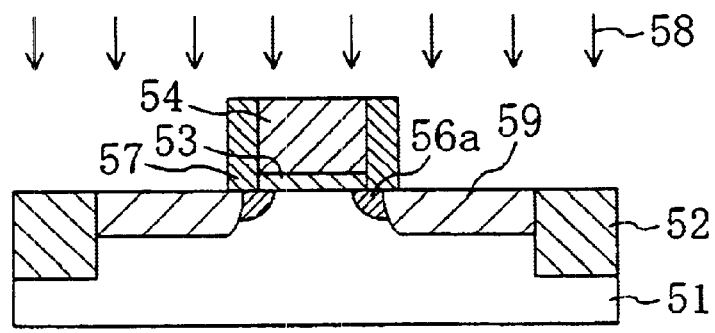
Figure 6D:
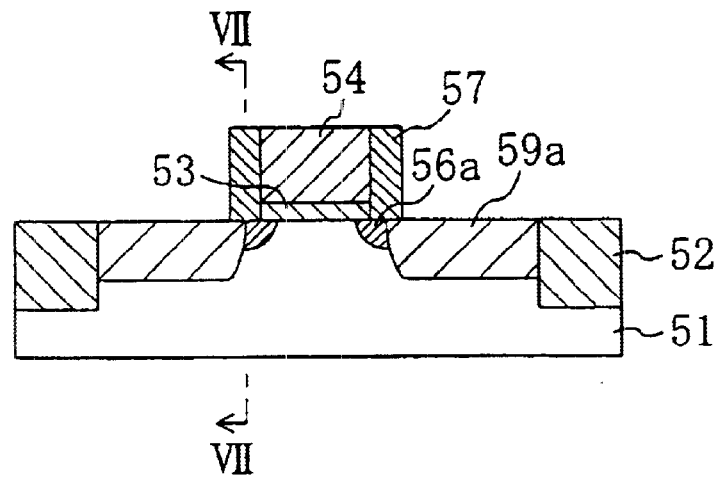

FIGS. 7A through 7D are graphs illustrating dopant concentration profiles in the depth direction for the cross section taken along the line VII—VII shown in FIG. 6D. The profiles shown in FIG. 7 were obtained for a region into which $BF_2^+$ was introduced at an acceleration voltage of 5 keV and at a dose of $1\times10^{15}$ ions/cm$^2$.

Figure 7A:
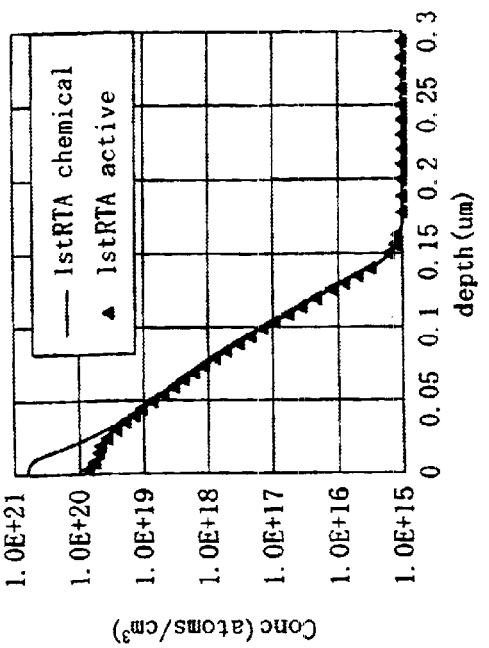
FIGS. 7A through 7D are graphs illustrating dopant concentration profiles in the depth direction for the cross section taken along the line VII—VII shown in FIG. 6D.

In FIG. 7A, the solid-line curve shows the concentration profile of boron introduced as a dopant for the ion-implanted layer 56 shown in FIG. 6A. At this point in time, the introduced dopant does not diffuse yet and is inactive.

Figure 7B:
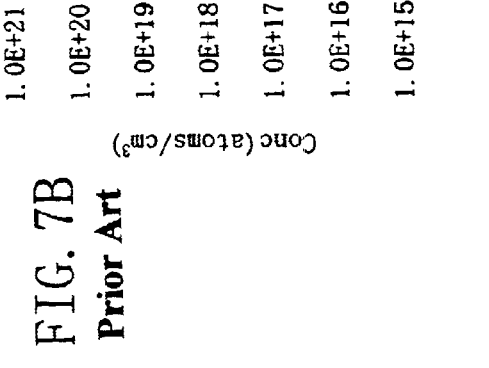
Figure 7B:
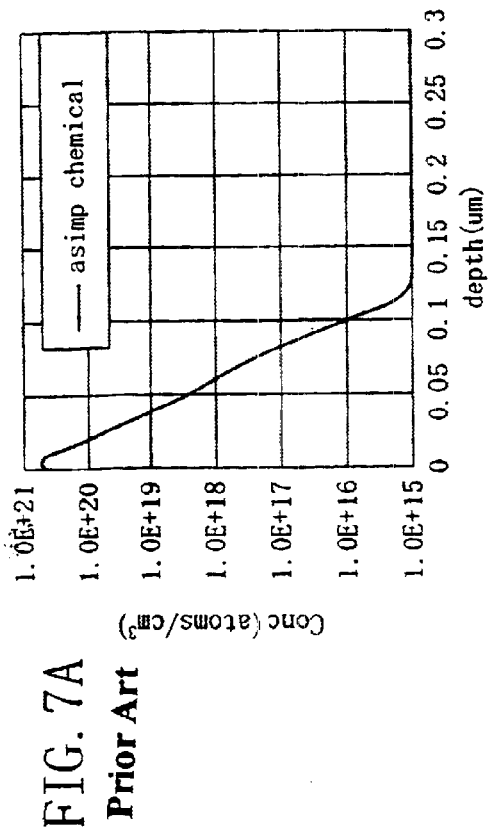

FIG. 7B is a graph illustrating a dopant concentration profile in the extended heavily doped layer 56a shown in FIG. 6B. In FIG. 7B, the solid-line curve shows the overall dopant concentration distribution and the solid triangles (▲) indicate the concentration distribution of activated ones of the dopant atoms introduced. Comparing the solid-line curves in FIGS. 7A and 7B to each other, it can be seen that the depth of, the doped layer increases and the peak concentration of the dopant decreases as a result of the first RTA process. In spite of that, the following can also be seen when the concentration distribution shown by the solid-line curve is compared to the concentration distribution indicated by the solid triangles in FIG. 7B. In the first RTA process, if the dopant is introduced at a dose equal to or less than the solid solubility thereof at the process temperature, all of the dopant atoms introduced can be activated. However, if the dose of the dopant is greater than the solid solubility, the excessive dopant atoms are not activated and remain inactive. Specifically, by carrying out the RTA process, the dopant atoms and interstitial silicon atoms would make pairs (I–V pair) and diffuse through each crystal lattice. When one of the pairs enters a lattice site, the pair would be activated. On the other hand, when multiple pairs of boron and interstitial silicon atoms gather and form an energetistically stable cluster, those atoms would be deactivated.

Figure 7C:
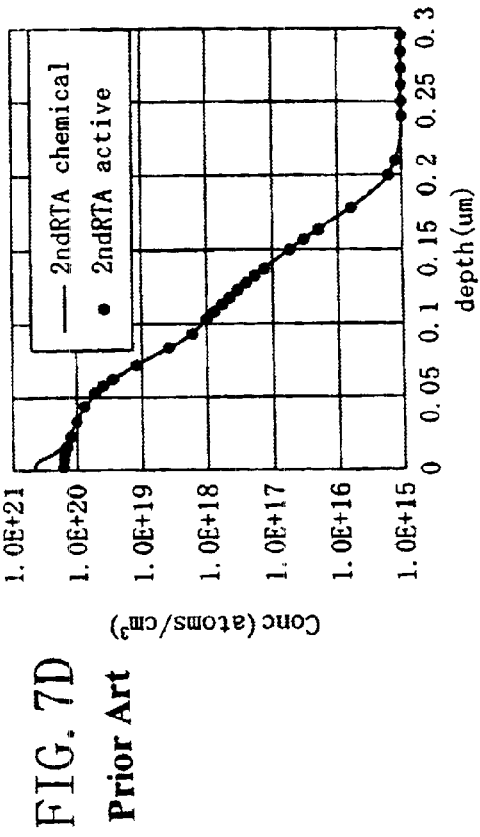

FIG. 7C is a graph illustrating a dopant concentration profile in the extended heavily doped layer 56a shown in FIG. 6C. In FIG. 7C, the solid-line curve shows the overall dopant concentration distribution and the solid diamonds (♦) indicate the concentration distribution of activated ones of the dopant atoms introduced. Comparing the concentration distribution indicated by the solid diamonds to that indicated by the solid triangles in FIG. 7B, it can be seen that the percentage of the activated dopant atoms decreases as a result of the deposition of the silicon nitride film. The reasons are as follows. Normally, a silicon nitride film is deposited at a temperature lower than the process temperature of the first RTA, so the solid solubility decreases. Thus, many of the pairs of boron and interstitial silicon atoms form new clusters. Accordingly, some of the dopant atoms that were activated through the first RTA process are deactivated again.

Figure 7D:
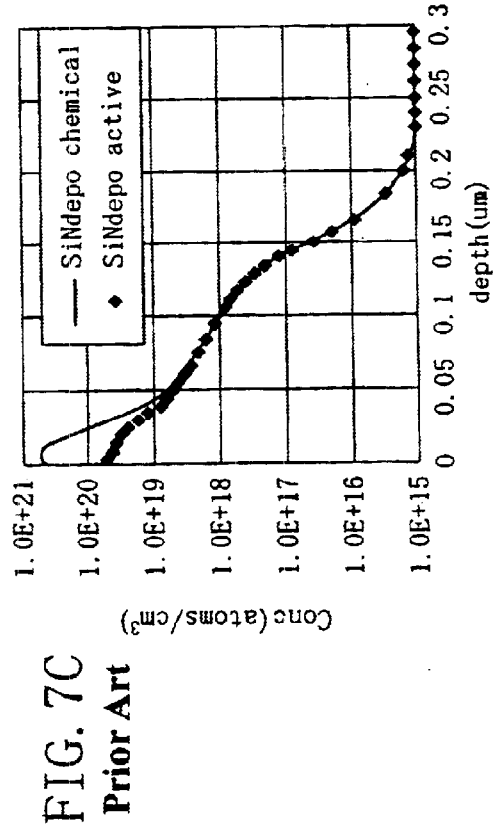

FIG. 7D is a graph illustrating a dopant concentration profile in the extended heavily doped layer 56a shown in FIG. 6D. In FIG. 7D, the solid-line curve shows the overall dopant concentration distribution and the solid circles (●) indicate the concentration distribution of activated ones of the dopant atoms introduced. Comparing the concentration distribution indicated by the solid circles to that indicated by the solid diamonds in FIG. 7C, it can be seen that the percentage of the activated dopant atoms increases as a result of the second RTA process. This is because the second RAT process is normally carried out at a temperature higher than that of the first RTA process in the known method. However, comparing the concentration distributions shown by the solid-line curve and the solid circles in FIG. 7D, it can be seen that the dopant atoms introduced are still far from being activated almost completely even after the second RTA process. That is to say, in the known method, some of the dopant atoms introduced remain inactive to precipitate or cluster together even though the RTA processes are carried out thereon twice.

Further, those inactive dopant atoms will worsen the situation in the subsequent process steps, which will be described with reference to FIGS. 8A and 8B.

Figure 8A:
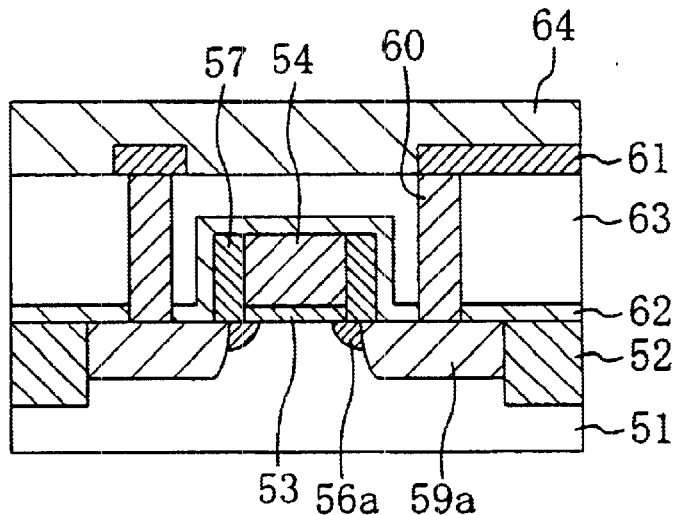
FIG. 8A is a cross-sectional view illustrating the final structure of a semiconductor device fabricated by a known method.
Figure 8B:
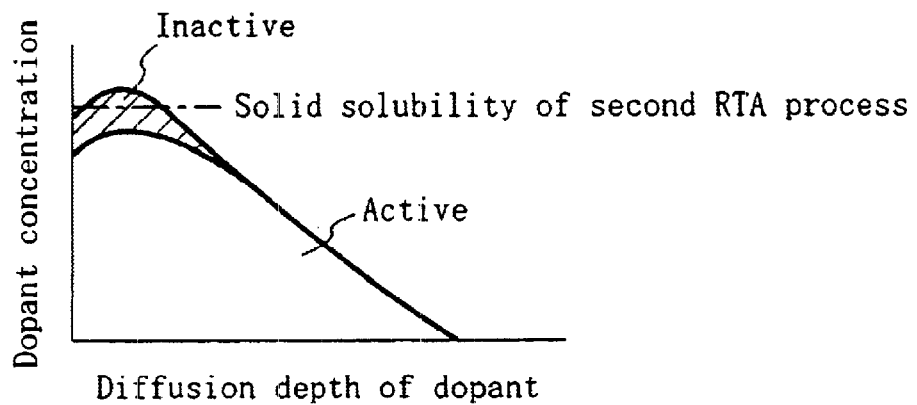
FIG. 8B is a graph illustrating dopant concentration profiles in the depth direction in the extended heavily doped layer of the semiconductor device shown in FIG. 8A.

FIG. 8A is a cross-sectional view illustrating the final structure of an MIS semiconductor device fabricated by the known method. FIG. 8B is a graph illustrating dopant concentration profiles in the extended heavily doped layer 56a shown in FIG. BA. After the second RTA process, the dopant shown in FIG. 8B has an increased diffusion depth and deactivated dopant atoms at a greater percentage. The reasons are as follows.

The final structure shown in FIG. 8A can be obtained by performing the following process steps. First, over the substrate that has been subjected to the second RTA process, an undercoat insulating film 62, BPSG film 63 and passivation film 64 are deposited through respective annealing processes. Thereafter, another annealing process is performed at a low temperature for a long time to reflow the BPSG film 63, for example. If there are any inactive dopant atoms when the second RTA is over, the percentage of the inactive dopant atoms increases while the substrate is annealed at a low temperature for a long time in the following process steps. This is because a phenomenon in which the inactive clusters further capture and deactivate active pairs prevails over a phenomenon in which the cluster is decomposed as a result of the annealing process to form new I–V pairs, which should diffuse through the lattice, enter the lattice sites and be activated. The deactivated atoms may also increase their number because the interstitial silicon atoms cluster together with the excessive, insoluble inactive boron atoms or boron atoms that have been once activated.

As described above, the present inventors proved that according to the known method, the more difficult it is to activate almost all dopant atoms through the first and second RTA processes, the higher the concentration of the dopant existing in the extended heavily doped layer 56a would be.

It is therefore an object of the present invention to increase the drivability by taking measures to get almost all ion-implanted dopant atoms activated when the second RTA is over.

Embodiment 1

Hereinafter, a method for fabricating a semiconductor device in accordance with a first embodiment of the present invention will be described with reference to FIGS. 1A through 1D and 2A through 2D.

FIGS. 1A through 1D are cross-sectional views illustrating process steps for fabricating a semiconductor device in accordance with this embodiment. First, in the process step shown in FIG. 1A, a trench isolation film 2 is formed in parts of an n-type semiconductor substrate 1 to define an active region. Then, a gate insulating film 3 and a gate electrode 4 of polysilicon are formed in this order on the active region in the semiconductor substrate 1. Thereafter, ions 5 of boron as a p-type dopant are implanted using the gate electrode 4 and the isolation film 2 as a mask to form an ion-implanted layer 6 as a prototype for an extended heavily doped layer. In this process step, the boron ions 5 may be implanted at a dose of $1.0 \times 10^{13}$ ions/cm$^2$, for example. As will be described in detail later, the dopant should be introduced at such an implant dose that almost all dopant atoms will have been activated when the first RTA process is over.

Figure 1A:
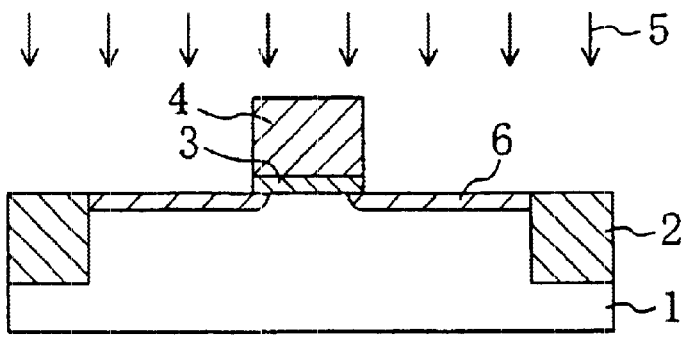
FIGS. 1A through 1D are cross-sectional views illustrating process steps for fabricating a semiconductor device in accordance with a first embodiment of the present invention.
Figure 1B:
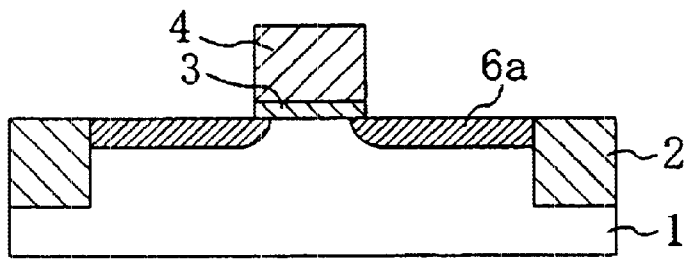

Next, in the process step shown in FIG. 1B, the first RTA process is performed under the conditions including 900° C. and 10 sec., for example, to activate the dopant existing in the ion-implanted layer 6. In this manner, an extended heavily doped layer 6a is formed. This annealing process should preferably be performed long enough to advance the activation reaction to 95% or more. That is to say, the annealing time is preferably set three or more times as long as the time constant of the activation reaction.

Subsequently, in the process step shown in FIG. 1C, a silicon nitride ($Si_3N_4$) film is deposited over the semiconductor substrate 1 under the conditions including 700° C. and 20 min., for example. Then, the silicon nitride film is etched anisotropically to form a sidewall 7 on the side faces of the gate electrode 4. Thereafter, ions 8 of boron as a p-type dopant are implanted into the semiconductor substrate using the gate electrode 4, sidewall 7 and isolation film 2 as a mask to form an ion-implanted layer 9 as a prototype for a heavily doped source/drain layer.

Figure 1C:
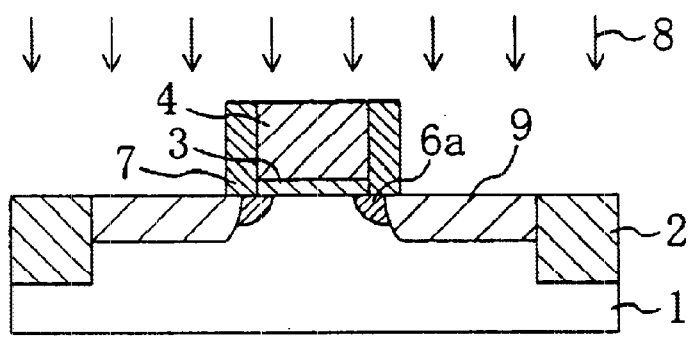
Figure 1D:
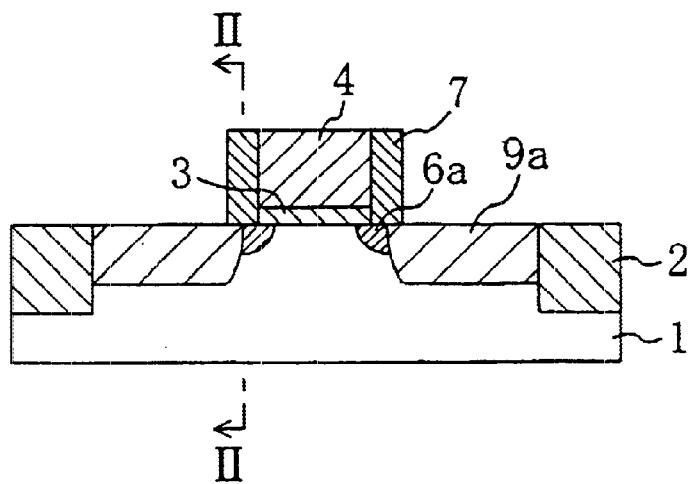

Then, in the process step shown in FIG. 1D, the second RTA process for activating the dopant existing in the ion-implanted layer 9 is carried out at a temperature higher than that of the first RTA process to define a heavily doped source/drain layer 9a. The process conditions for the second RTA include 1100° C. and 5 sec., for example.

Figure 3A:
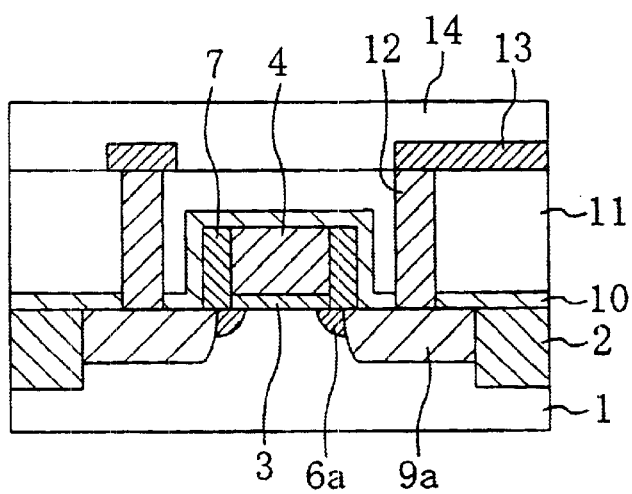
FIG. 3A is a cross-sectional view illustrating the final structure of a semiconductor device in accordance with the first embodiment.

Then, over the semiconductor substrate 1, undercoat insulating film 10, interlevel dielectric film 11 of BPSG, contacts 12 connected to the heavily doped source/drain layer 9a, interconnects 13 connected to the contacts 12, and passivation film 14 are formed. In this manner, the MIS semiconductor device shown in FIG. 3A can be obtained.

Hereinafter, the states of the dopant in the respective process steps of this embodiment will be described with reference to FIGS. 1A through 1D and 2A through 2D.

FIGS. 2A through 2D are graphs illustrating dopant concentration profiles in the depth direction for the cross section taken along the line II—II shown in FIG. 1D.

Figure 2A:
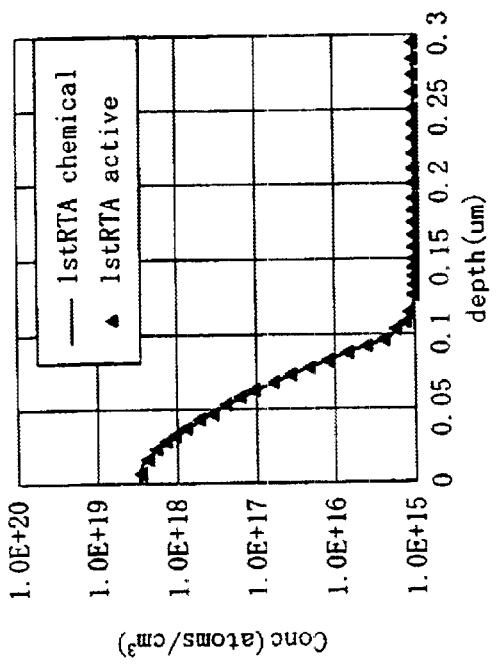
FIGS. 2A through 2D are graphs illustrating dopant concentration profiles in the depth direction for the cross sect taken along the line II—II shown in FIG. 1D.

FIG. 2A is a graph illustrating a dopant concentration profile in the ion-implanted layer 6 shown in FIG. 1A. In this process step, $BF_2^+$ ions are implanted into the substrate at a dose of $1.0 \times 10^{13}$ ions/cm$^2$ and at an acceleration voltage of 5 keV. In this process step, the dopant should be introduced at such an implant dose that all the dopant atoms will be activated through the first RTA process afterward. At this point in time, the dopant that has been introduced into the ion-implanted layer 6 is inactive.

Figure 2B:
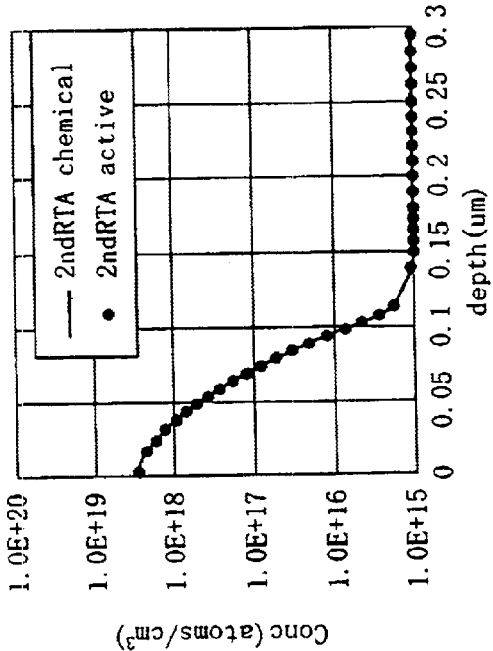

FIG. 2B is a graph illustrating an overall dopant concentration profile in the extended heavily doped layer 6a shown in FIG. 1B. In FIG. 2B, the solid-line curve shows the overall dopant concentration distribution while the solid triangles (▼) show the concentration distribution of activated ones of the dopant atoms introduced. Comparing the solid-line curves shown in FIGS. 2A and 2B to each other, it can be seen that the dopant has diffused because the maximum concentration of the dopant has decreased to some extent and the depth of the doped layer has slightly increased as a result of the first, RTA process. On the other hand, comparing the solid-line curve and solid triangles shown in FIG. 2B to each other, it can be seen that almost all dopant atoms, existing in the extended heavily doped layer 6a, have been activated since the solid triangles are located substantially on the solid-line curve. This is because the dopant is introduced in the process step shown in FIG. 1A at such a dose that the maximum dopant concentration will be equal to or less than the solid solubility thereof and equal to or greater than a predetermined percentage of the solid solubility (e.g., 90 to 100% or 95 to 100% of the solid solubility) when the first RTA process is over.

Figure 2C:
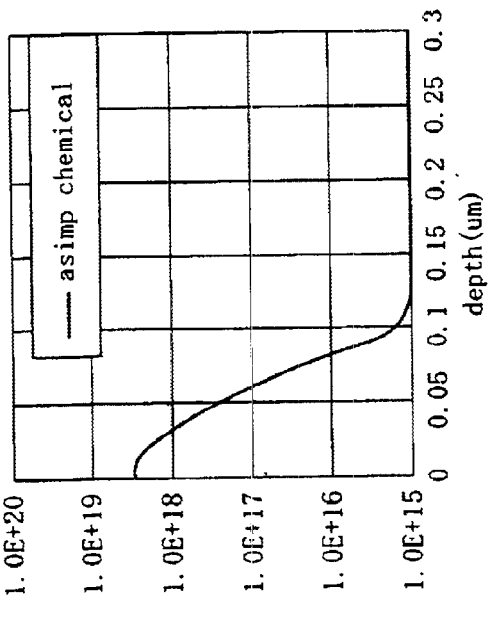

FIG. 2C is a graph illustrating a dopant concentration profile in the extended heavily doped layer 6a shown in FIG. 1C. In FIG. 2C, the solid-line curve shows the overall dopant concentration distribution and the solid diamonds (♦) indicate the concentration distribution of activated ones of the dopant atoms introduced. In this process step, the silicon nitride film is deposited at 700° C., for example, which is lower than the process temperature (e.g., 900° C.) of the first RTA. In spite of that, comparing the solid-line curve and the solid diamonds shown in FIG. 2C to each other, it can be seen that almost all dopant atoms introduced are still kept activated in this process step. The reason is as follows. There are no clusters or precipitates of inactive dopant atoms in the extended heavily doped layer 6a that has been subjected to the first RTA process. Thus, even though the silicon nitride film is deposited in this process step, almost no clusters or precipitates newly capture and deactivate active dopant atoms.

Figure 2D:
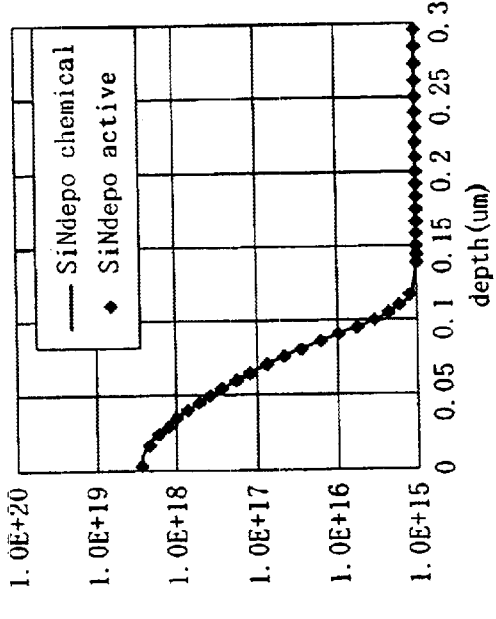

FIG. 2D is a graph illustrating a dopant concentration profile in the extended heavily doped layer 6a shown in FIG. 1D. In FIG. 2D, the solid-line curve shows the overall dopant concentration distribution and the solid circles (●) indicate the concentration distribution of activated ones of the dopant atoms introduced. Comparing the solid-line curve and solid circles shown in FIG. 2D to each other, it can be seen that almost no dopant atoms are deactivated in the extended heavily doped layer 6a and almost all dopant atoms remain activated.

Figure 3B:
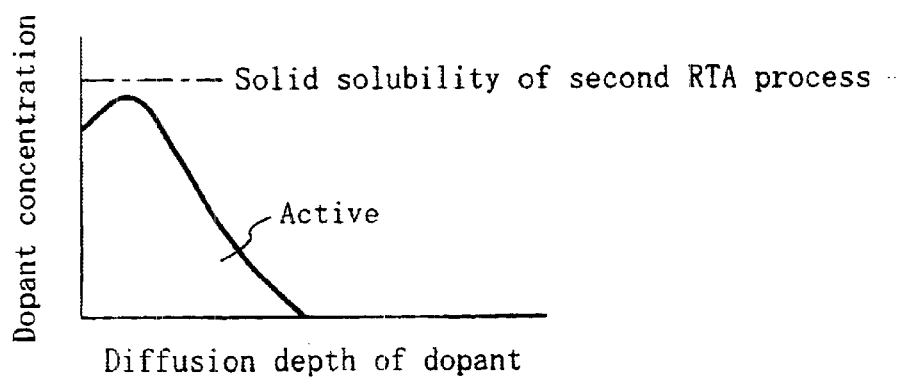
FIG. 3B is a graph illustrating a dopant concentration profile in the depth direction in the extended heavily doped layer of the semiconductor device shown in FIG. 3A.

In the fabrication process of the first embodiment, the dopant ions are implanted in the process step shown in FIG. 1A at such a dose that the maximum concentration of the dopant existing in the ion-implanted layer 6 will not exceed the solid solubility of the first RTA process and will at least equal a predetermined percentage of the solid solubility. Then, when the first RTA process is over, almost all dopant atoms existing in the extended heavily doped layer 6a will be activated and almost no dopant atoms will cluster together or precipitate. Accordingly, no dopant atoms will be deactivated as shown in FIG. 3B even after an annealing process has been performed at a high temperature to deposit the silicon nitride film or even after annealing processes have been carried out to obtain the final structure shown in FIG. 3A. That is to say, there will be no dopant atoms deactivated after the annealing processes for depositing the undercoat insulating film 10, interlevel dielectric film 11 and passivation film 14 are over or after the low-temperature annealing process has been performed for a long time to reflow the BPSG film to be the interlevel dielectric film 11.

For these reasons, in this embodiment, the resistance should not increase because almost no dopant atoms are deactivated in the extended heavily doped layer 6a. Further, in this embodiment, the implant dose of the dopant is lower than that of the known method. Specifically, although boron is introduced at a dose of about $1.0 \times 10^{15}$ ions/cm$^2$ in the known method, boron is introduced at a dose of $1.0 \times 10^{13}$ ions/cm$^2$, for example, in this embodiment. Thus, the dopant has a decreased diffusion depth when annealed. As a result, the extended heavily doped layer 6a has its junction depth reduced and an MIS semiconductor device with a high drivability can be obtained.

Embodiment 2

Hereinafter, a method for fabricating a semiconductor device in accordance with a second embodiment of the present invention will be described with reference to FIGS. 4A through 4D and 5A through 5D.

FIGS. 4A through 4D are cross-sectional views illustrating process steps for fabricating a semiconductor device in accordance with this embodiment. First, in the process step shown in FIG. 4A, a trench isolation film 2 is formed in parts of an n-type semiconductor substrate 1 to define an active region. Then, a gate electrode 4 of polysilicon is formed over the active region in the semiconductor substrate 1 with a gate insulating film 3 interposed between them. Thereafter, ions 15 of boron as a p-type dopant are implanted using the gate electrode 4 and the isolation film 2 as a mask to form an ion-implanted layer 16 as a prototype for an extended heavily doped layer. In this process step, the boron ions 15 may be implanted at a dose of $1.0 \times 10^{14}$ ions/cm$^2$, for example. As will be described in detail later, the dopant should be introduced at such an implant dose that almost all dopant atoms will have been activated when the second RTA process is over.

Figure 4A:
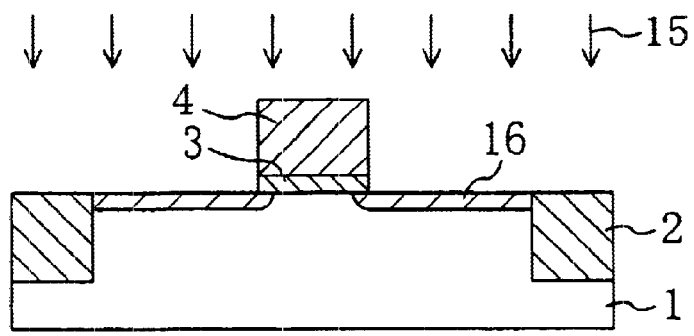
FIGS. 4A through 4D are cross-sectional views illustrating process steps for fabricating a semiconductor device in accordance with a second embodiment of the present invention.
Figure 4B:
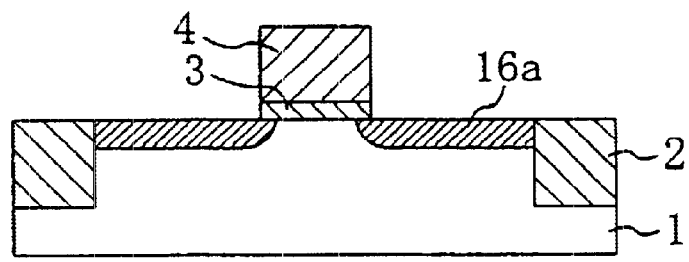

Next, in the process step shown in FIG. 4B, the first RTA process is performed under the conditions including 900° C. and 10 sec., for example, to activate the dopant existing in the ion-implanted layer 16. In this manner, an extended heavily doped layer 16a is formed.

Subsequently, in the process step shown in FIG. 4C, a silicon nitride ($Si_3N_4$) film is deposited over the semiconductor substrate 1 under the conditions including 700° C. and 20 min., for example. Then, the silicon nitride film is etched anisotropically to form a sidewall 7 on the side faces of the gate electrode 4. Thereafter, ions 8 of boron as a p-type dopant are implanted using the gate electrode 4, sidewall 7 and isolation film 2 as a mask to form an ion-implanted layer 9 as a prototype for a heavily doped source/drain layer.

Figure 4C:
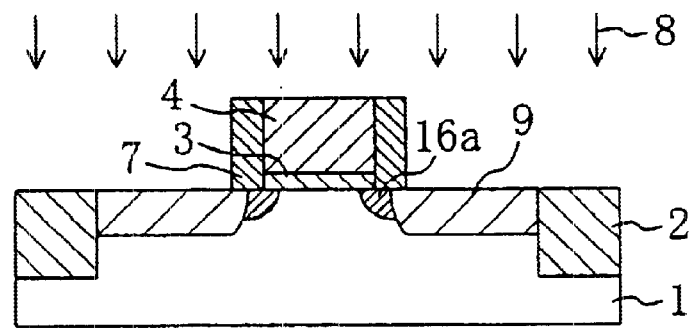
Figure 4D:
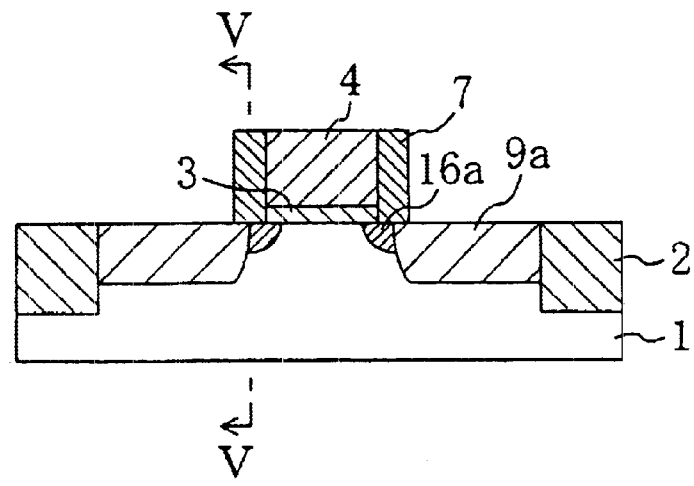

Then, in the process step shown in FIG. 4D, the second RTA process for activating the dopant existing in the ion-implanted layer 9 is carried out at a temperature higher than that of the first RTA process to define a heavily doped source/drain layer 9a. Normally, a process temperature for the second RTA is the highest of the process temperatures of all process steps. The process conditions for the second RTA include 1100° C. and 5 sec., for example. This annealing process should preferably be performed long enough to advance the activation reaction to 95% or more. That is to say, the annealing time is preferably set three or more times as long as the time constant of the activation reaction.

Then, over the semiconductor substrate 1, undercoat insulating film, interlevel dielectric film of BPSG, contacts connected to the heavily doped source/drain layer 9a, interconnects connected to the contacts, and passivation film are formed through the same process steps as those of the first embodiment. In this manner, an MIS semiconductor device can be obtained.

Hereinafter, the states of the dopant in the respective process steps of this embodiment will be described with reference to FIGS. 4A through 4D and 5A through 5D. FIGS. 5A through 5D are graphs illustrating dopant concentration profiles in the depth direction for the cross section taken along the line V—V shown in FIG. 4D.

Figure 5A:
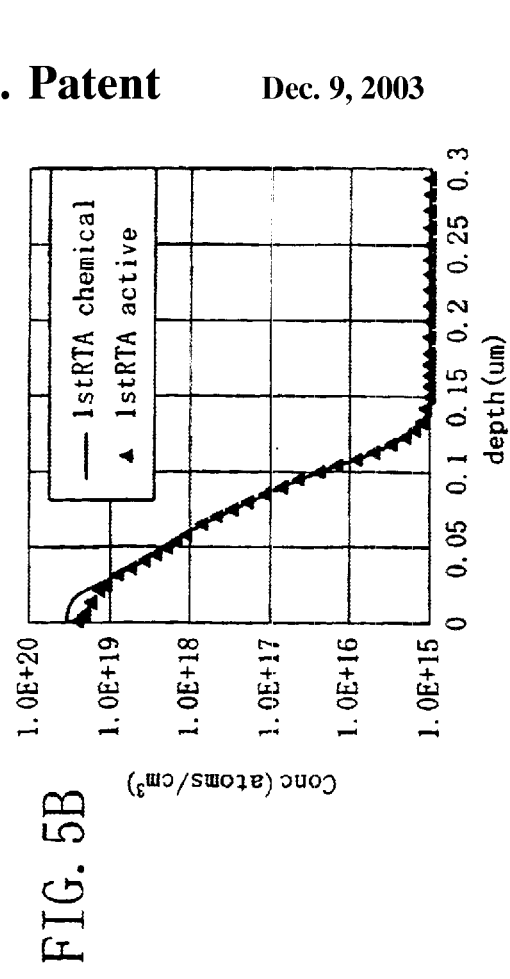
FIGS. 5A through 5D are graphs illustrating dopant concentration profiles in the depth direction for the cross section taken along the line V—V shown in FIG. 4D.

FIG. 5A is a graph illustrating a dopant concentration profile in the ion-implanted layer 16 shown in FIG. 4A. In this process step, $BF_2^+$ ions may be implanted into the substrate at a dose of $1.0 \times 10^{14}$ ions/cm$^2$ and at an acceleration voltage of 5 keV. As will be described in detail later, the dopant should be introduced in this process step at such an implant dose that all the dopant atoms will be activated through the succeeding second RTA process. At this point in time, the dopant that has been introduced into the ion-implanted layer 16 is inactive.

Figure 5B:
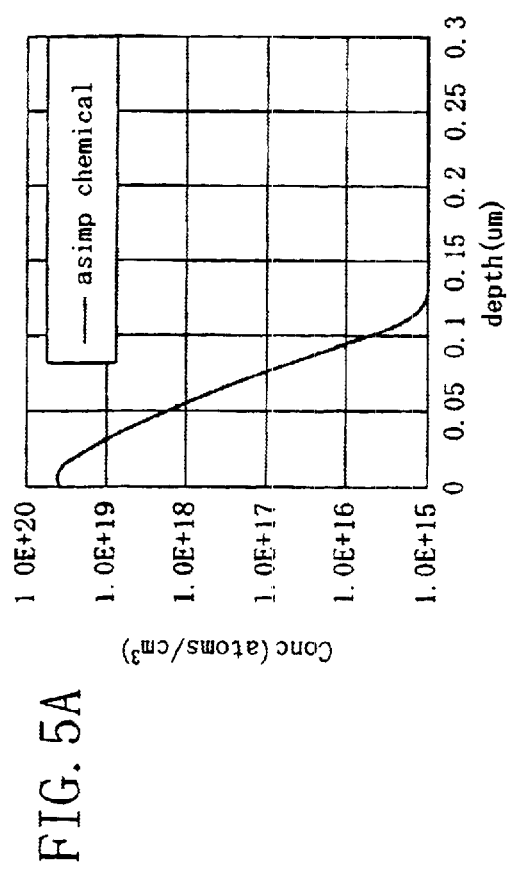

FIG. 5B is a graph illustrating a dopant concentration profile in the extended heavily doped layer 16a shown in FIG. 4B. In FIG. 5B, the solid-line curve shows the overall dopant concentration distribution while the solid triangles (▼) indicate the concentration distribution of activated ones of the dopant atoms introduced. Comparing the solid-line curves shown in FIGS. 5A and 5B to each other, it can be seen that the dopant has diffused because the maximum concentration of the dopant has decreased and the depth of the doped layer has increased as a result of the first RTA process. On the other hand, comparing the solid-line curve and solid-triangle curve shown in FIG. 5B to each other, it can be seen that the solid-triangle curve is located below the solid-line curve in the uppermost part of the doped layer, which has a depth of less than about 0.025 μm. That is to say, it can be seen that the first RTA process activates the dopant atoms up to the solid solubility at the process temperature, but allows the other excessive dopant atoms to remain inactive.

Figure 5C:
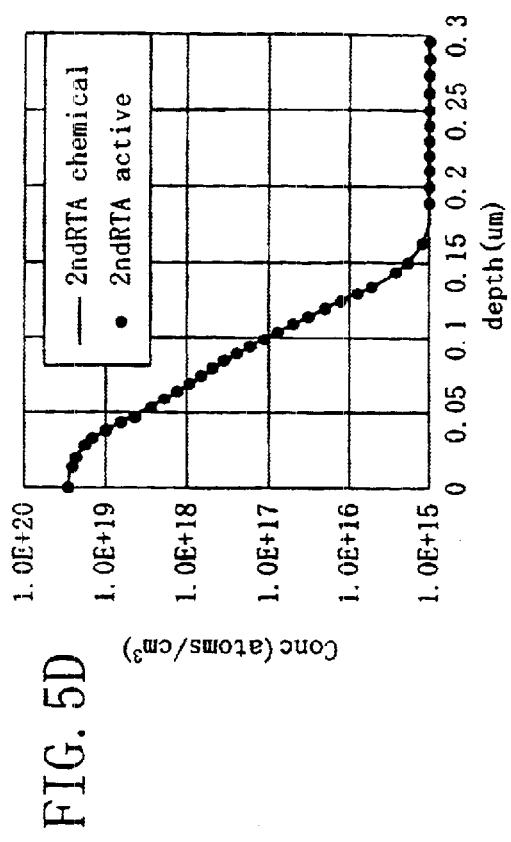

FIG. 5C is a graph illustrating a dopant concentration profile in the extended heavily doped layer 16a shown in FIG. 4C. In FIG. 5C, the solid-line curve shows the overall dopant concentration distribution and the solid diamonds (♦) indicate the concentration distribution of activated ones of the dopant atoms introduced. In the uppermost part of the doped layer (e.g., to a depth of about 0.05 μm or less), the concentrations indicated by the solid diamonds are lower than those of the dopant atoms that had been activated when the first RTA process was over, as indicated by the solid triangles in FIG. 5B. The reason is as follows. The temperature of this process step may be 700° C., which is lower than the process temperature (e.g., 900° C.) of the first RTA. Thus, the inactive dopant atoms remaining after the previous first RTA process newly capture and deactivate active dopant atoms in this process step. As a result, the percentage of deactivated dopant atoms increases as compared to those that remained when the first RTA process was over.

Figure 5D:
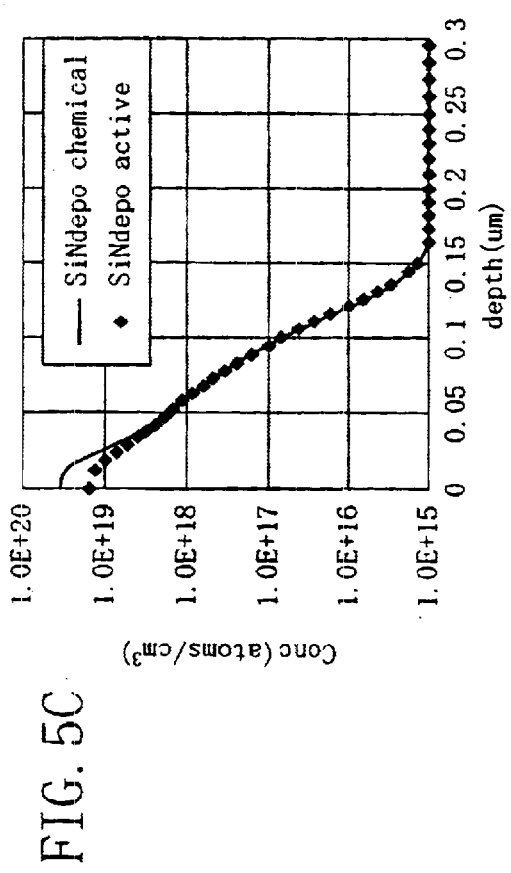

FIG. 5D is a graph illustrating a dopant concentration profile in the extended heavily doped layer 16a shown in FIG. 4D. In FIG. 5D, the solid-line curve shows the overall dopant concentration distribution and the solid circles (●) indicate the concentration distribution of activated ones of the dopant atoms introduced. Comparing the solid-line curve and solid circles shown in FIG. 5D to each other, it can be seen that almost all dopant atoms have been activated in the extended heavily doped layer 16a. In this manner, to activate almost all of the existing dopant through the second RTA process, the dopant is introduced in this embodiment at such a dose that the maximum dopant concentration will be equal to or less than, and close to, the solid solubility at the temperature when the second RTA process is over. For example, the maximum concentration may be 90 to 100% of the solid solubility.

As described above, in this embodiment, the dopant is introduced at such a dose that the maximum concentration of the dopant existing in the extended heavily doped layer 16a will not exceed the solid solubility thereof and will at least equal a predetermined percentage of the solid solubility when the second RTA process is over. In that case, when the second RTA process is over, almost all dopant atoms existing in the extended heavily doped layer 16a will be activated.

Accordingly, no dopant atoms will be deactivated in the extended heavily doped layer 16a even after annealing processes have been carried out at a low temperature and for a long time in the process steps succeeding the second RTA process. That is to say, there will be no dopant atoms deactivated after the annealing processes for depositing the undercoat insulating film, interlevel dielectric film and passivation film or for reflowing the BPSG film to be the interlevel dielectric film are over. Thus, all dopant atoms, existing in the extended heavily doped layer 16a, will also be kept activated at that time just like when the second RTA process was over. The reason is as follows. Once all dopant atoms, existing in the extended heavily doped layer 16a, have been activated through the second RTA process, there will be no clusters or precipitates of inactive dopant atoms. Thus, even though the annealing processes are performed at low temperatures afterward, no dopant atoms will be deactivated anymore.

Normally, the second RTA process is performed at a temperature higher than that of the first RTA process. This means, that the solid solubility at the second RTA process temperature is higher than that of the first RTA process temperature. Thus, to form the extended heavily doped layer 16a according to the second embodiment, the dopant may be implanted into the substrate at a dose higher than that of the first embodiment in which the implant dose is determined according to the solid solubility at the first RTA process temperature. Specifically, although boron is introduced at a dose of $1.0\times10^{13}$ ions/cm$^2$ in the first embodiment, boron is introduced at a dose of $1.0\times10^{14}$ ions/cm$^2$ in the second embodiment. Consequently, the extended heavily doped layer 16a can have its resistance further reduced.

Further, the implant dose (e.g., $1.0\times10^{14}$ ions/cm$^2$) of the boron ions according to this embodiment is lower than the dose (e.g., about $1.0\times10^{15}$ ions/cm$^2$) of the known method. Thus, the dopant has a decreased diffusion depth when annealed. Accordingly, the extended heavily doped layer 16a can have its junction depth reduced. In addition, the short channel effect can be suppressed and the punch-through voltage can be raised. As a result, a high-performance MIS semiconductor device with high drivability can be obtained.

Optional Embodiments

For the first and second embodiments, it has been described how the extended heavily doped layer can have its resistance reduced. Optionally, in forming the gate electrode of polysilicon or the heavily doped source/drain layer, any dopant required may be introduced at a dose at least equal to or greater than a predetermined percentage of the solid solubility of the first annealing process for activating the dopant and equal to or less than the solid solubility of the second annealing process that needs the highest temperature in the process steps succeeding the implantation of the dopant ions. Then, all dopant atoms introduced into the gate electrode or the heavily doped source/drain layer can be activated and the resistance thereof can be reduced.

What is claimed is:

1. A method for fabricating a semiconductor device, comprising the steps of:
    a) forming a gate electrode over a semiconductor layer with a gate insulating film interposed between the gate electrode and the semiconductor layer;
    b) forming a first ion-implanted layer in parts of the semiconductor layer that are located beside the gate electrode by ion implanting a first dopant using the gate electrode as a mask;
    c) subjecting the first ion-implanted layer to a first annealing process; and
    d) subjecting the semiconductor layer to a second annealing process, thereby forming a heavily doped region out of the first ion-implanted layer after the step c) has been performed,
    wherein the temperature of the second annealing process is higher than the temperature of the first annealing process,
    wherein in the step b), the first dopant is introduced at such a dose that a maximum concentration of the first dopant when the first annealing process is over will be greater than a predetermined percentage of a solid solubility at a process temperature of the first annealing process and that a maximum concentration of the first dopant when the second annealing process is over will be equal to or less than a solid solubility at a process temperature of the second annealing process, and
    wherein in the step d), the second annealing process is performed at the highest process temperature in all process steps succeeding the step b).

2. The method of claim 1, wherein almost all of the first dopant existing in the first ion-implanted layer is activated through the first annealing process.

3. The method of claim 1, wherein in the step c), the maximum concentration of the first dopant is 90 to 100% of the solid solubility at the process temperature of the first annealing process.

4. The method of claim 1, wherein in step c), the maximum concentration of the first dopant is greater than solid solubility at the process temperature of the first annealing process, and
    wherein in the step d), the maximum concentration of the first dopant is 90 to 100% of the solid solubility at the process temperature of the second annealing process.

5. A The method of claim 1, wherein the method further comprises the steps of:
    forming a sidewall on the side faces of the gate electrode after the step c) has been performed, and
    introducing a second dopant by an ion implantation process using the gate electrode and the sidewall as a mask, thereby forming a second ion-implanted layer, and
    wherein the step d) further includes forming an extended heavily doped layer and a heavily doped source/drain layer out of the first and second ion-implanted layers, respectively, so that the extended heavily doped layer is located below edges of the gate electrode and that the heavily doped source/drain layer surrounds the outer periphery of, and is in contact with, the extended heavily doped layer and has a junction deeper than the junction of the extended heavily doped layer, and
    wherein the extended heavily doped layer is the heavily doped region.

6. The method of claim 5, wherein after the first dopant has been introduced into the semiconductor layer in the step b), almost all of the first dopant is activated by performing the first annealing process in the step c), and
    wherein the second dopant is introduced into the semiconductor layer by the ion implantation process before the step d) is performed, and
    wherein in the step d), the second dopant is activated through the second annealing process, thereby forming the extended heavily doped layer and the heavily doped source/drain layer.

7. The method of claim 1, wherein the first annealing process and the second annealing process are rapid thermal annealing processes.

* * * * *